United States Patent [19]
Hashimoto

[11] Patent Number: 5,742,558
[45] Date of Patent: Apr. 21, 1998

[54] SEMICONDUCTOR MEMORY DEVICE FOR PLURALITY OF RANGES OF POWER SUPPLY VOLTAGE

[75] Inventor: Kiyokazu Hashimoto, Tokyo, Japan

[73] Assignee: NEC Corporation, Tokyo, Japan

[21] Appl. No.: 608,055

[22] Filed: Feb. 28, 1996

[30] Foreign Application Priority Data

Feb. 28, 1995 [JP] Japan ............................ 7-040219

[51] Int. Cl.$^6$ ........................................... G11C 7/00
[52] U.S. Cl. ........................ 365/233.5; 365/233
[58] Field of Search .................... 365/233.5, 233, 365/194

[56] References Cited

U.S. PATENT DOCUMENTS 4,972,374  11/1990  Wang ............................ 365/233.5
5,428,580   6/1995  Kawashima ..................... 365/233.5

*Primary Examiner*—A. Zarabian

[57] ABSTRACT

In a semiconductor memory device including an address transition detecting circuit, a timing pulse generating circuit for generating a timing pulse signal in response to an output signal of the address transition detecting circuit, and a sense amplifier for sensing data read from a memory cell array, the sense amplifier is made active by the timing pulse signal. A power supply voltage determining circuit determines whether or not a power supply voltage is higher than a certain value, and a pulse width of the timing pulse signal is controlled by an output of the power supply voltage determining circuit.

11 Claims, 17 Drawing Sheets

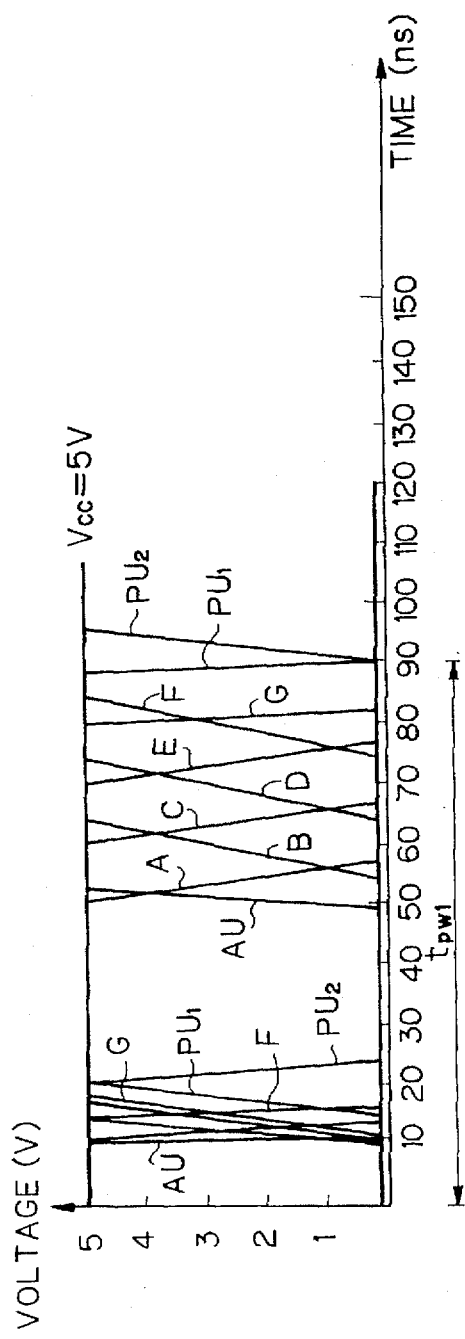
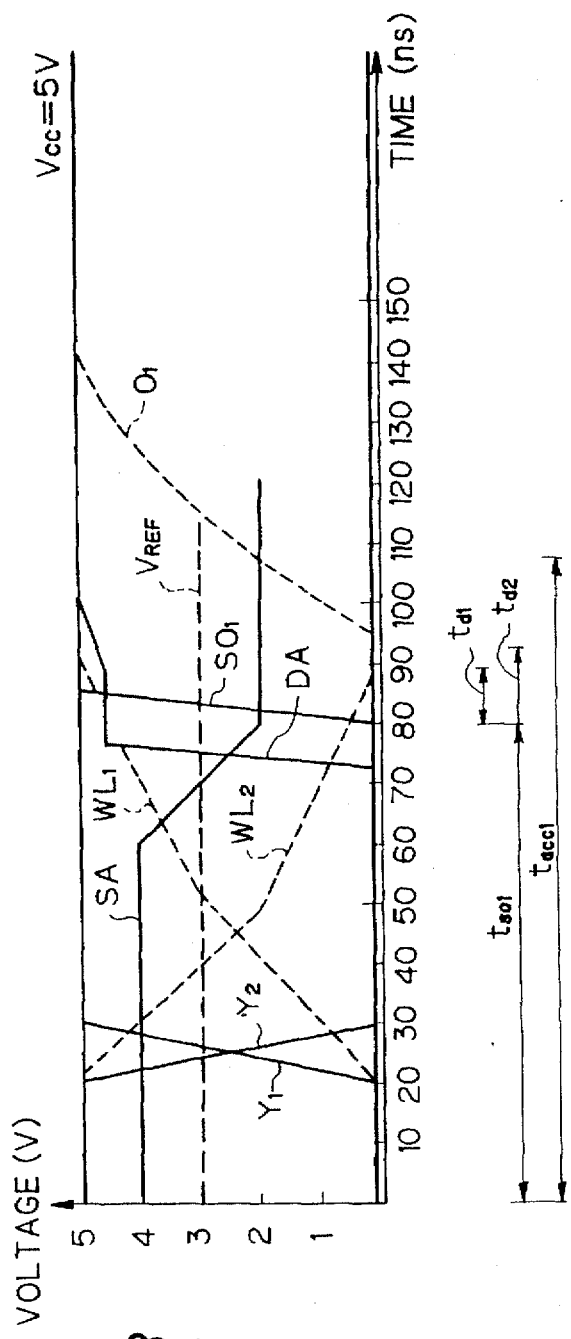
Fig. 7A PRIOR ART
Fig. 7B PRIOR ART

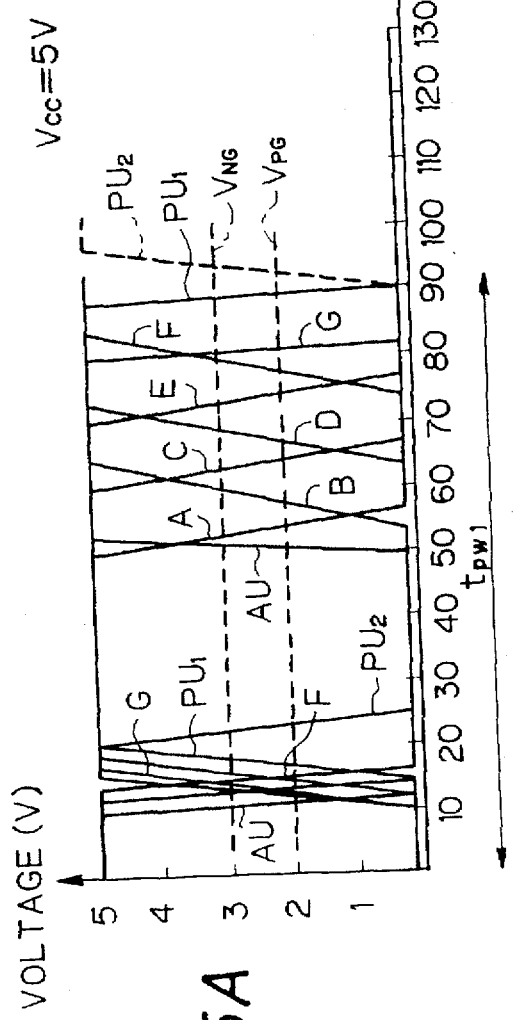
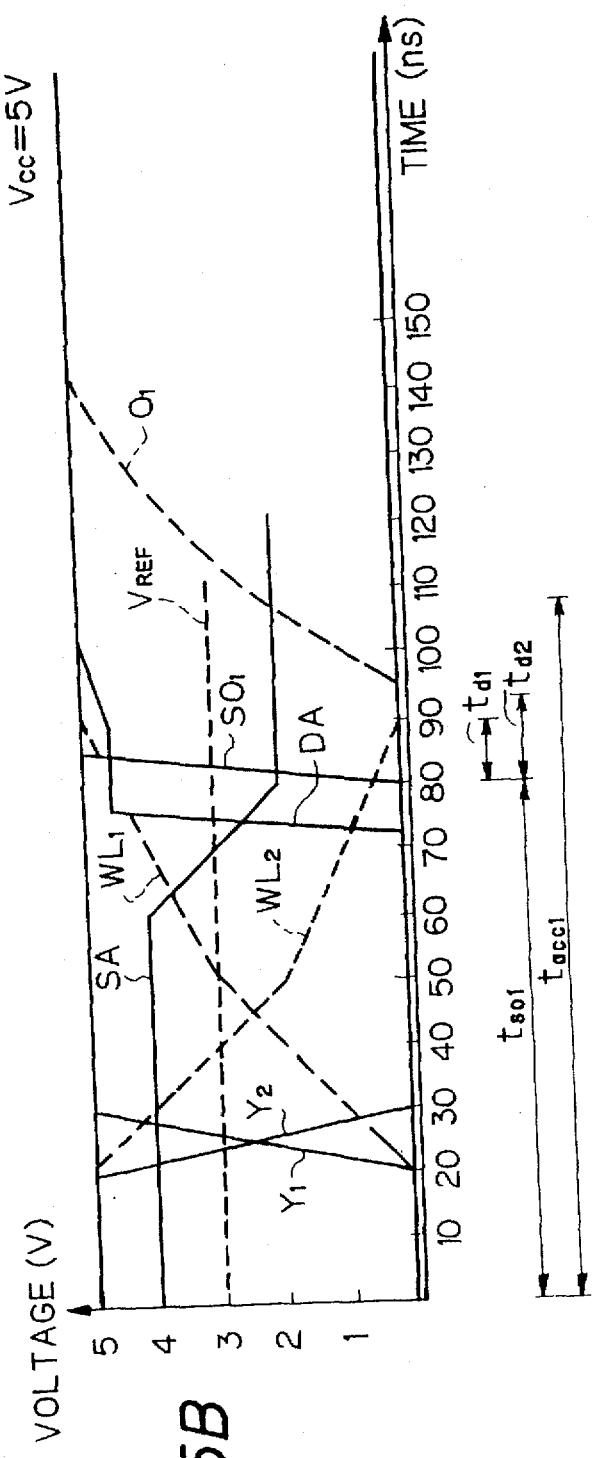
Fig. 15A
Fig. 15B

SEMICONDUCTOR MEMORY DEVICE FOR PLURALITY OF RANGES OF POWER SUPPLY VOLTAGE

BACKGROUND OF THE INVENTION

1. Field of the Invention

The present invention relates to a semiconductor memory device adapted to a plurality of ranges of power supply voltage.

2. Description of the Related Art

Generally, a prior art semiconductor memory device such as a nonvolatile memory device includes an address transition detecting circuit, a timing pulse generating circuit for generating a timing pulse signal in response to an output signal of the address transition detecting circuit, and a sense amplifier for sensing data read from a memory cell array, the sense amplifier is made active by the timing pulse signal. This will be explained later in detail.

In the above-described prior art semiconductor device, however, a pulse width of the timing pulse signal is greatly dependent upon a power supply voltage. That is, the lower the power supply voltage, the longer the pulse width of the timing pulse signal. Note that, even when the power supply voltage is low, determination of an output of the sense amplifier is not so slow, since buffers, decoders and the like are designed to be operated at a high speed even with a low power supply voltage. Therefore, when the power supply voltage is reduced, the power dissipation of the sense amplifier is increased, thus increasing the power dissipation in a read mode. Also, this decreases a read access speed.

In another prior art semiconductor memory device, in order to alleviate the dependency of the timing pulse signal upon the power supply voltage, the pulse width of the timing pulse signal is changed in accordance with the power supply voltage. In this case, however, since use is made of a control circuit whose output is dependent upon threshold voltages of transistors therein, when these threshold voltages fluctuate, the same problems as in the first prior art semiconductor memory device may occur.

SUMMARY OF THE INVENTION

It is an object of the present invention to provide a semiconductor memory device adapted to a plurality of ranges of a power supply voltage with a low power dissipation and a high read access speed.

According to the present invention, in a semiconductor memory device including an address transition detecting circuit, a timing pulse generating circuit for generating a timing pulse signal in response to an output signal of the address transition detecting circuit, and a sense amplifier for sensing data read from a memory cell array, the sense amplifier is made active by the timing pulse signal. A power supply voltage determining circuit determines whether or not a power supply voltage is higher than a certain value, and a pulse width of the timing pulse signal is controlled by an output of the power supply voltage determining circuit. Thus, the pulse width is not dependent upon threshold voltages.

BRIEF DESCRIPTION OF THE DRAWINGS

The present invention will be more clearly understood from the description as set forth below, in comparison with the prior art, with reference to the accompanying drawings, wherein:

FIG. 7A is a timing diagram showing the operation of the circuit of FIG. 6 where $V_{CC}=5V$;

FIG. 7B is a timing diagram showing the operation of the device of FIG. 1 where $V_{CC}=5V$;

FIG. 15A is a timing diagram showing the operation of the circuit of FIG. 14 where $V_{CC}=5V$;

FIG. 15B is a timing diagram showing the operation of the device of FIG. 11 where $V_{CC}=5V$;

DESCRIPTION OF THE PREFERRED EMBODIMENT

Before the description of the preferred embodiment, a prior art semiconductor memory device will be explained with reference to FIGS. 1, 2, 3, 4, 5, 6, 7A, 7B, 8A, 8B, 9 and 10.

Figure 1:
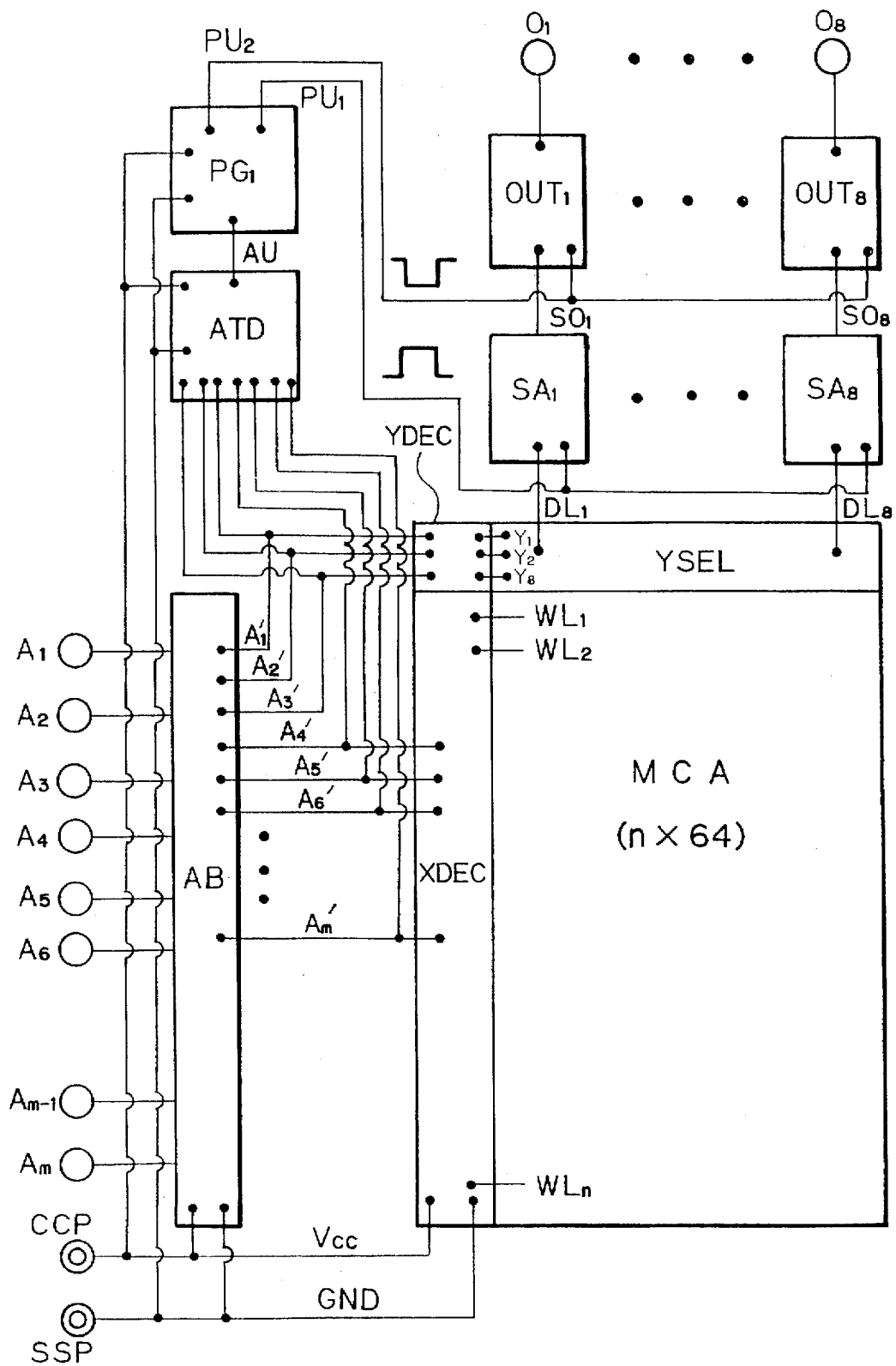
FIG. 1 is a block circuit diagram illustrating a prior art semiconductor memory device.

In FIG. 1, which illustrates a prior art semiconductor memory device, reference CCP designates an external power supply terminal to which a power supply voltage $V_{CC}$ is applied, and reference SSP designates an external ground voltage terminal to which a ground voltage GND is applied.

An address buffer AB receives external address signals $A_1, A_2, A_3, A_4, A_5, A_6, \ldots, A_{m-1}$ and $A_m$, to generate internal address signals $A_1', A_2', A_3', A_4', A_5', A_6', \ldots, A_{m-1}'$ and $A_m'$.

Figure 2:
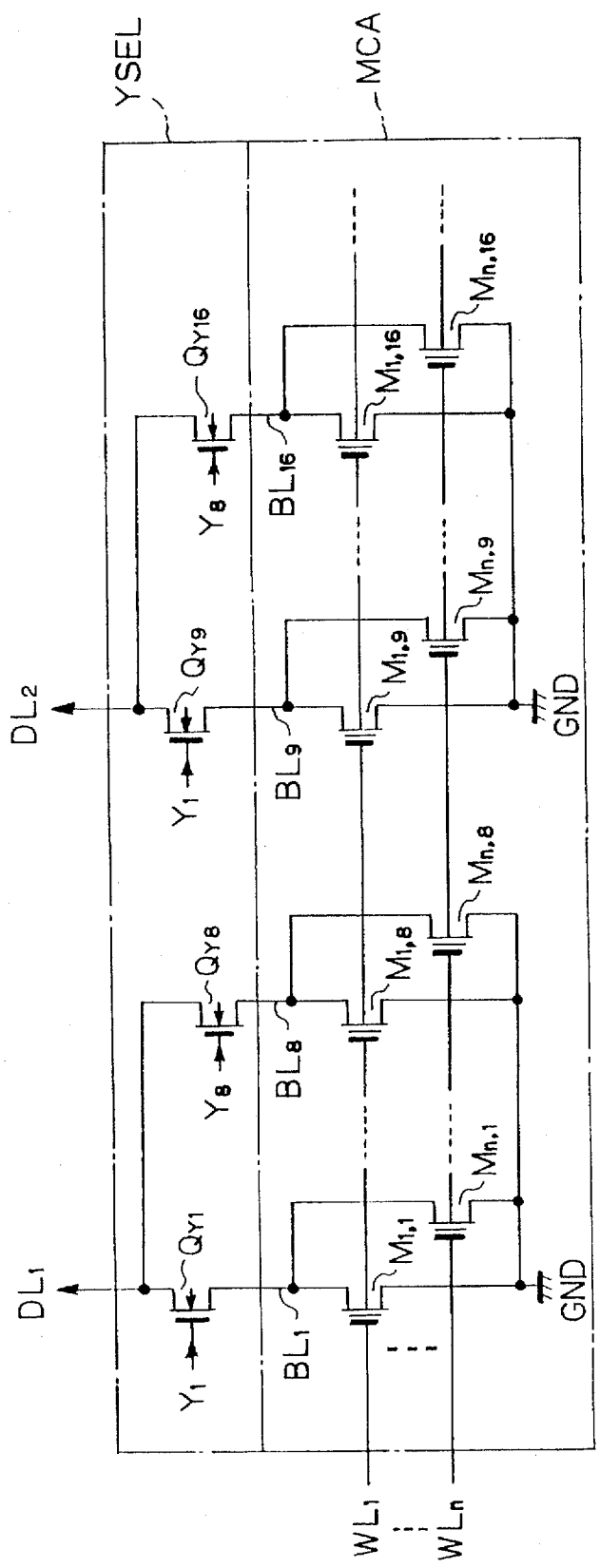
FIG. 2 is a circuit diagram of the memory cell array and the Y selector of FIG. 1.

A memory cell array MCA is comprised of $n \times 8 \times 8$ memory cells such as nonvolatile memory cells $M_{i,j}$ ($i=1, 2, \ldots, n; j=1, 2, \ldots, 64$) provided at intersections between n word lines $WL_1, \ldots, WL_n$ and 64 bit lines $BL_1, \ldots, BL_8$, $BL_9, \ldots, BL_{16}, \ldots$ as illustrated in FIG. 2.

One of the word lines $WL_1, WL_2, \ldots, WL_n$ is selected by an X decoder XDEC which receives the internal address signals $A_4', A_5', \ldots, A_m'$. Also, one of the bit lines $BL_1, \ldots, BL_8$, one of the bit lines $BL_9, \ldots, BL_{16}, \ldots$, are selected by a Y selector YSEL which receives Y selection signals $Y_1, Y_2, \ldots, Y_8$. In this case, the Y selection signals $Y_1, Y_2, \ldots, Y_8$ are generated by a Y decoder YDEC which receives the internal address signals $A_1', A_2'$, and $A_3'$ to generate the Y selection signals $Y_1, Y_2, \ldots, Y_8$. As illustrated in FIG. 2, one of the bit lines $BL_1, \ldots, BL_8$ is connected to a digit line $DL_1$, one of the bit lines $BL_9, \ldots, BL_{16}$ is connected to a digit line $DL_2$, and so on.

The digit lines $DL_1, \ldots, DL_8$ are connected to sense amplifiers $SA_1, \ldots, SA_8$, respectively. Also, outputs $SO_1, \ldots, SO_8$ of the sense amplifiers $SA_1, \ldots, SA_8$ are connected to output buffers $OUT_1, \ldots, OUT_8$, respectively, which are connected to output terminals $O_1, \ldots, O_8$, respectively.

The sense amplifiers $SA_1, \ldots, SA_8$ and the output buffers $OUT_1, \ldots, OUT_8$ are controlled by timing pulse signals $PU_1$ and $PU_2$ which are generated by an address transition detecting circuit ATD and a timing pulse signal generating circuit $PG_1$.

Figure 3:
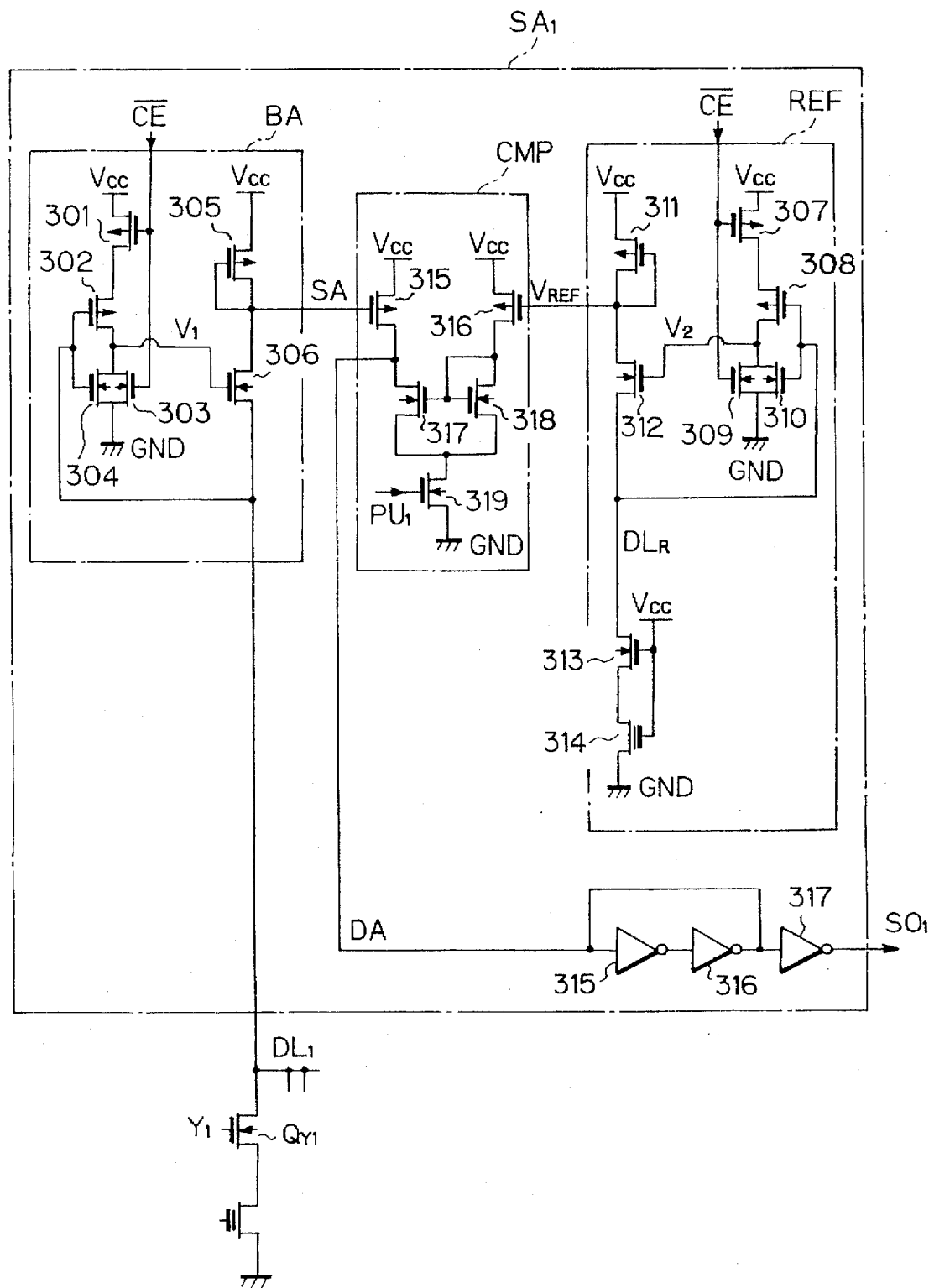
FIG. 3 is a detailed circuit diagram of the sense amplifier of FIG. 1.

In FIG. 3, which is a detailed circuit diagram of the sense amplifier $SA_1$ of FIG. 1, the sense amplifier $SA_1$ includes a bias circuit BA for supplying bias voltage to the digit line $DL_1$, a reference circuit REF for generating a reference voltage $V_{REF}$, and a comparator CMP for comparing an output voltage SA of the bias circuit BA with the reference voltage $V_{REF}$ of the reference voltage generating circuit REF. An output voltage DA of the comparator CMP is supplied via inverters 315, 316 and 317 as a sense output $SO_1$ to the output buffer $OUT_1$. In this case, the inverters 315 and 316 form a latch circuit.

The bias circuit BA is comprised of a NOR circuit formed by a P-channel MOS transistor 301 controlled by a chip enable signal CE, a P-channel MOS transistor 302 controlled by the voltage at the digit line $DL_1$, an N-channel MOS transistor 303 controlled by the chip enable signal CE and an N-channel MOS transistor 304 controlled by the voltage at the digit line $DL_1$. Also, the bias circuit BA is comprised of a feedback inverter formed by a P-channel MOS transistor 305 serving as a load, and a N-channel MOS transistor 306 serving as a driver. An output voltage $V_1$ of the NOR circuit is amplified by the feedback inverter to generate the output voltage SA.

The reference voltage generating circuit REF has a similar configuration to the bias circuit BA. That is, the reference voltage generating circuit REF is comprised of a NOR circuit formed by a P-channel MOS transistor 307 controlled by the chip enable signal CE, a P-channel MOS transistor 308 controlled by the voltage at a reference digit line $DL_R$, an N-channel MOS transistor 309 controlled by the chip enable signal CE and an N-channel MOS transistor 310 controlled by the voltage at the reference digit line $DL_R$. Also, the reference voltage generating circuit REF is comprised of a feedback inverter formed by a P-channel MOS transistor 311 serving as a load, and an N-channel MOS transistor 312 serving as driver. An output voltage $V_2$ of the NOR circuit is amplified by the feedback inverter to generate the reference voltage $V_{REF}$.

In the reference voltage generating circuit REF, the reference digit line $DL_R$ corresponds to the digit line $DL_1$. Therefore, connected to the reference digit line $DL_R$ is an N-channel MOS transistor 313 corresponding to one of column selection transistors $Q_{Y1}, \ldots, Q_{Y8}$ of FIG. 2 and a dummy memory cell 314 corresponding to one of the memory cells $M_{1,1}, \ldots$ of FIG. 2.

Also, the current drive capabilities of the transistors 301, 302, 303, 304 and 306 of the bias circuit BA are the same as those of the transistors 307, 308, 309, 310 and 312 of the reference voltage generating circuit REF, respectively. However, the current drive capability of the transistor 311 of the reference voltage generating circuit REF is twice that of the transistor 305 of the bias circuit BA.

The comparator CMP is comprised of a differential amplifier including P-channel MOS transistors 315 and 316 for receiving the output voltage SA of the bias circuit BA and the reference voltage $V_{REF}$ of the reference voltage generating circuit REF, respectively, and N-channel MOS transistors 317, 318 and 319. In this case, the transistors 317 and 318 form a current mirror circuit.

In the sense amplifier $SA_1$ of FIG. 3, if a memory cell having data "0" is selected, the output voltage SA of the bias circuit BA becomes lower than the reference voltage $V_{REF}$, so that an output voltage DA of the comparator CMP is made high, and accordingly, the sense output $SO_1$ is made low. On the other hand, if a memory cell having data "1" is selected, the output voltage SA of the bias circuit BA becomes higher than the reference voltage $V_{REF}$, so that the output voltage DA of the comparator CMP is made low, and accordingly, the sense output $SO_1$ is made high.

The comparator CMP is made active or inactive by turning ON or OFF the transistor 319 in accordance with the timing pulse signal $PU_1$, thus reducing the power dissipation.

Figure 4:
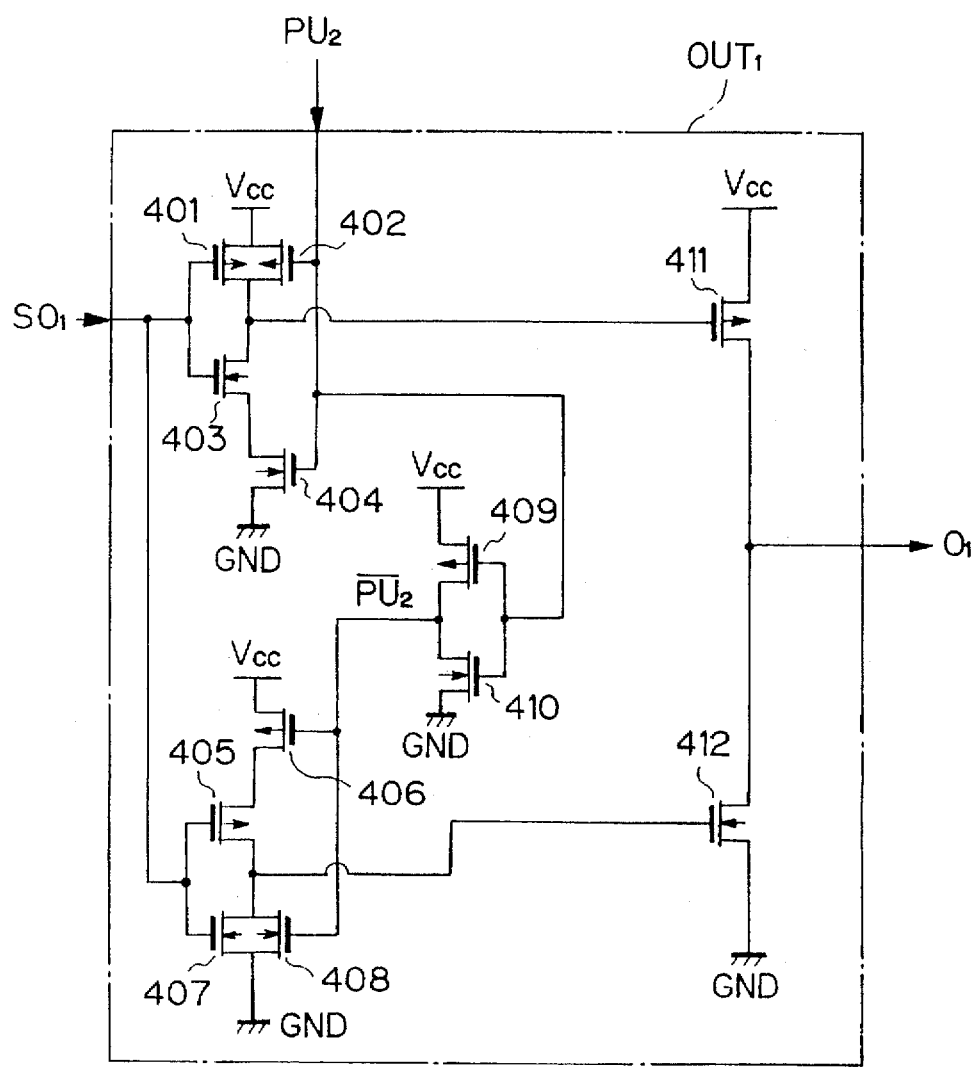
FIG. 4 is a detailed circuit diagram of the output buffer of FIG. 1.

In FIG. 4, which is a detailed circuit diagram of the output buffer $OUT_1$ of FIG. 2, the output buffer $OUT_1$ is comprised of a NAND circuit formed by a P-channel MOS transistor 401 controlled by the sense output $SO_1$, a P-channel MOS transistor 402 controlled by the timing pulse signal $PU_2$, an N-channel MOS transistor 403 controlled by the sense output $SO_1$, and an N-channel MOS transistor 404 controlled by the timing pulse signal $PU_2$. Also, the output buffer $OUT_1$ is comprised of a NOR circuit formed by a P-channel MOS transistor 405 controlled by the sense output $SO_1$, a P-channel MOS transistor 406 controlled by an inverted signal of the timing pulse signal $PU_2$, an N-channel MOS transistor 407 controlled by the sense output $SO_1$, and an N-channel MOS transistor 408 controlled by the inverted signal of the timing pulse signal $PU_2$. The inverted signal of the timing pulse signal $PU_2$ is generated by an inverter formed by a P-channel transistor 409 and an N-channel MOS transistor 410. The output of the NAND circuit is supplied to a P-channel MOS transistor 411 having a large current drive capability. Also, the output of the NOR circuit is supplied to an N-channel MOS transistor 412 having a large current drive capability.

Since the output buffer $OUT_1$ is comprised of a CMOS circuit, the power dissipation of the output buffer $OUT_1$ is relatively small. However, the output buffer $OUT_1$ is made active or inactive in accordance with the timing pulse signal $PU_2$. That is, when the timing pulse signal $PU_2$ is high, the transistors 402 and 404 are turned OFF and ON, respectively, so that the NAND circuit serves as an inverter and the transistors 406 and 408 are turned ON and OFF, respectively, so that the NOR circuit serves as an inverter. Thus, the output buffer $OUT_1$ is active. On the other hand, when the timing pulse signal $PU_2$ is low, the transistors 402 and 404 are turned ON and OFF, respectively, so that the output of the NAND circuit is always high and the transistors 406 and 408 are turned OFF and ON, respectively, so that the output of the NOR circuit is always low. As a result, the transistors 411 and 412 are always turned OFF. Thus, the output buffer $OUT_1$ is inactive.

Since the output buffer $OUT_1$ is made active or inactive in accordance with the timing pulse signal $PU_2$ synchronously with the active/inactive operation of the sense amplifier $SA_1$ in accordance with the timing pulse signal $PU_1$, the erroneous operation of the sense amplifier $SA_1$ due to the generation of noise by the output buffer $OUT_1$ can be avoided.

Figure 5:
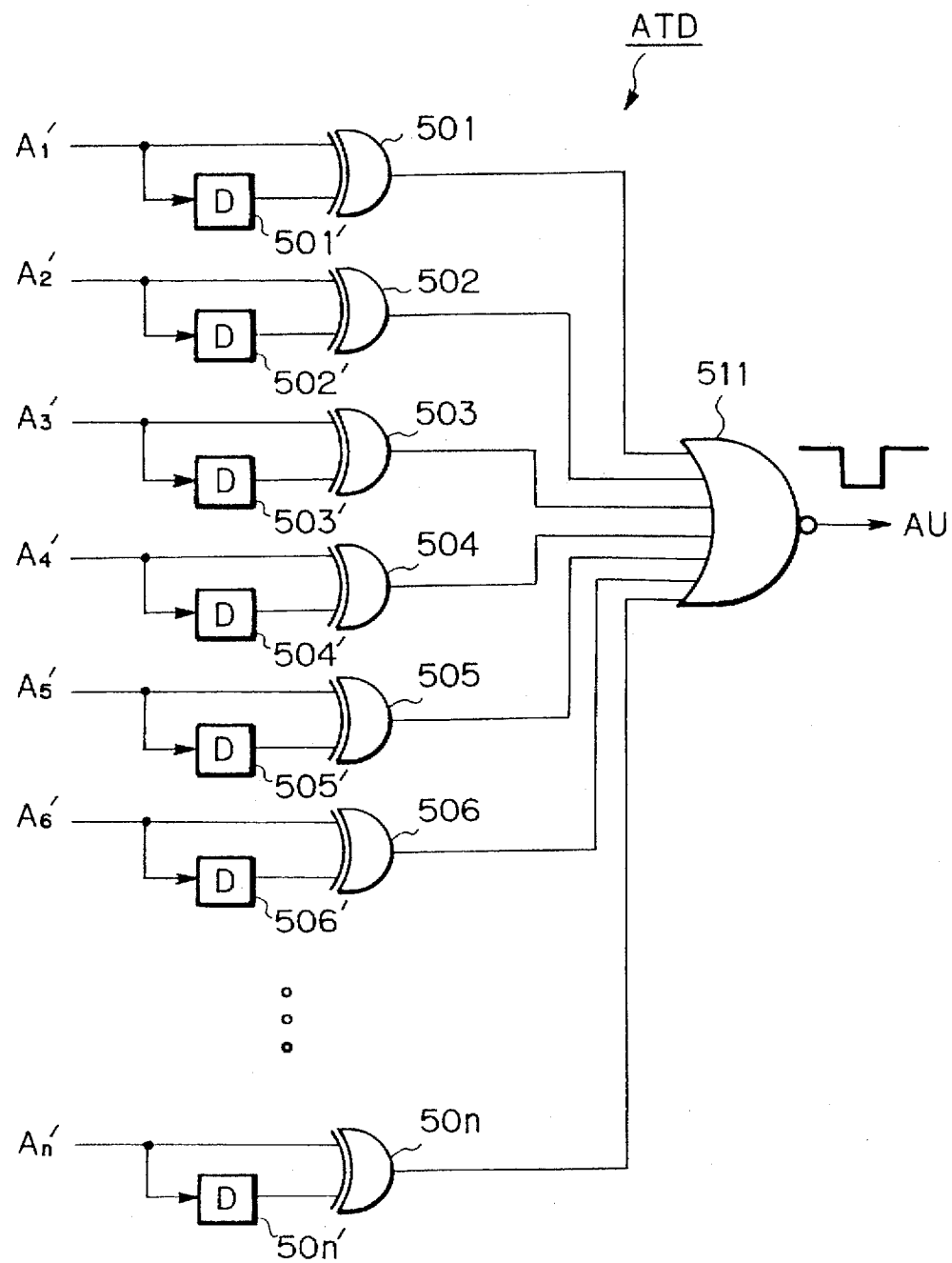
FIG. 5 is a detailed circuit diagram of the address transition detection circuit of FIG. 1.

In FIG. 5, which is a detailed circuit diagram of the address transition detecting circuit ATD of FIG. 1, the address transition detecting circuit ATD includes an exclusive OR circuit 501 and a delay circuit 501' for detecting a transition of the internal address signal $A_1'$, an exclusive OR circuit 502 and a delay circuit 502' for detecting a transition of the internal address signal $A_2'$, an exclusive OR circuit 503 and a delay circuit 503' for detecting a transition of the internal address signal $A_3'$, an exclusive OR circuit 504 and a delay circuit 504' for detecting a transition of the internal address signal $A_4'$, an exclusive OR circuit 505 and a delay circuit 505' for detecting a transition of the internal address signal $A_5'$, an exclusive OR circuit 506 and a delay circuit 506' for detecting a transition of the internal address signal $A_6'$, . . . , and an exclusive OR circuit 50n and a delay circuit 50n' for detecting a transition of the internal address signal $A_n'$. The outputs of the exclusive OR circuits 501, 502, 503, 504, 505, 506, . . . , 50n are connected to a NOR circuit 511. As a result, when at least one of the internal address signals $A_1'$, $A_2'$, $A_3'$, $A_4'$, $A_5'$, $A_6'$, . . . , $A_n'$ is changed, the corresponding exclusive OR circuit generates a pulse signal having a pulse width determined by the delay circuits 501', 502', 503', 504', 505', 506', . . . , or 50n'. Therefore, the NOR circuit 511 generates an address transition signal AU.

Figure 6:
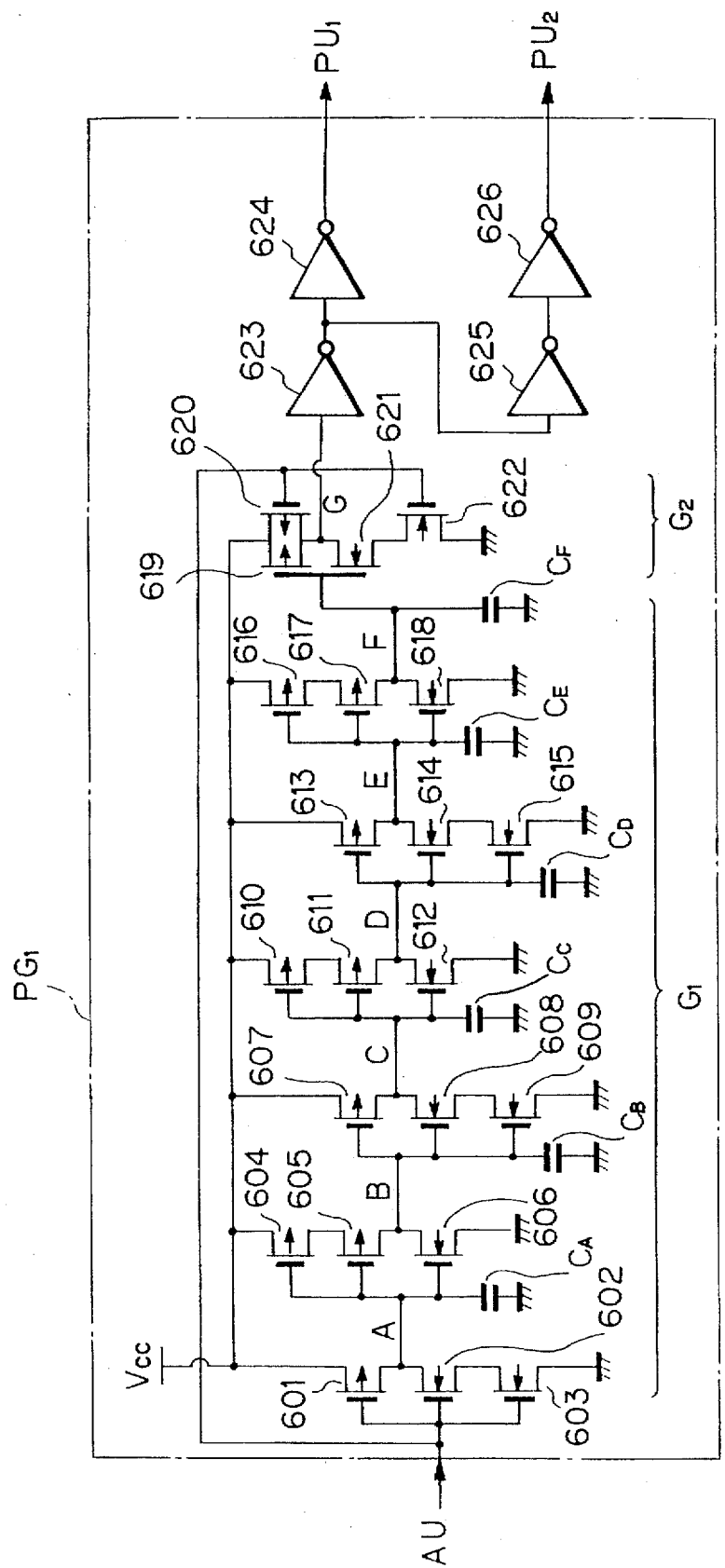
FIG. 6 is a detailed circuit diagram of the timing pulse generating circuit of FIG. 1.

In FIG. 6, which is a detailed circuit diagram of the timing pulse generating circuit $PG_1$ of FIG. 1, a P-channel MOS transistor 601 is provided to charge a node A at a capacitor $C_A$, and N-channel MOS transistors 602 and 603 are provided to discharge the node A at the capacitor $C_A$. P-channel MOS transistors 604 and 605 are provided to charge a node B at a capacitor $C_B$, and an N-channel MOS transistor 606 is provided to discharge the node B at the capacitor $C_B$. A P-channel MOS transistor 607 is provided to charge a node C at a capacitor $C_C$, and N-channel MOS transistors 608 and 609 are provided to discharge the node C at the capacitor $C_C$. P-channel MOS transistors 610 and 611 are provided to charge a node D at a capacitor $C_D$, and an N-channel MOS transistor 612 is provided to discharge the node D at the capacitor $C_D$. A P-channel MOS transistor 613 is provided to charge a node E at a capacitor $C_E$, and N-channel MOS transistors 614 and 615 are provided to discharge the node E at the capacitor $C_E$. P-channel MOS transistors 616 and 617 are provided to charge a node F at a capacitor $C_F$, and an N-channel MOS transistor 618, provided to discharge the node F at the capacitor $C_F$.

The transistors 601 to 618 and the capacitors $C_A$ to $C_F$ form a delay circuit $G_1$. In this case, a delay time when the address transition signal AU is changed from a low level to a high level is much larger than a delay time when the address transition signal AU is changed from a high level to a low level. That is, the current drive capabilities of the transistors 602 and 603 are much smaller than the current drive capability of the transistor 601. The current drive capabilities of the transistors 604 and 605 are much smaller than the current drive capability of the transistor 606. The current drive capabilities of the transistors 608 and 609 are much smaller than the current drive capability of the transistor 607. The current drive capabilities of the transistors 610 and 611 are much smaller than the current drive capability of the transistor 609. The current drive capabilities of the transistors 614 and 615 are much smaller than the current drive capability of the transistor 613. The current drive capabilities of the transistors 616 and 617 are much smaller than the current drive capability of the transistor 618.

P-channel MOS transistors 619 and 620 and N-channel MOS transistors 621 and 620 form a NAND circuit $G_2$. That is, the address transition signal ATD and the output voltage of the delay circuit $G_1$ are supplied to the NAND circuit $G_2$.

The output voltage of the NAND circuit $G_2$ is supplied to inverters 623 and 624, thus generating the timing pulse signal $PU_1$. Also, the output voltage of the NAND circuit $G_2$ is supplied to the inverter 623, and inverters 625 and 626, thus generating the timing pulse signal $PU_2$.

The operation of the timing pulse generating circuit $PG_1$ of FIG. 6 is explained next with reference to FIG. 7A where the power supply voltage $V_{CC}$ is 5V.

About 10 ns after at least one of the address signals $A_1$, $A_2$, . . . , $A_n$ is changed, the address transition detection signal AU falls. As a result, in the delay circuit $G_1$, the nodes A, C and E are rapidly charged by the transistors 601, 607 and 613, respectively, and the nodes B, D and F are rapidly discharged by the transistors 606, 612 and 618 respectively. On the other hand, in the NAND circuit $G_2$, the transistors 620 and 622 are turned ON and OFF, respectively, by the address transition detection signal AU, and as a result, the node G is rapidly charged regardless of the operation of the delay circuit $G_1$. Thus, the timing pulse signal $PU_1$ is rapidly changed from low to high, and a short time later, the timing pulse signal $PU_2$ is rapidly changed from high to low.

Next, about 50 ns after at least one of the address signals $A_1, A_2, \ldots, A_n$ is changed, the address transition detection signal AU rises. As a result, in the NAND circuit $G_2$, the transistors 620 and 622 are turned OFF and ON, respectively; however, since the transistors 619 and 621 are still turned ON and OFF, respectively, the voltage at the node G remains high.

After the address transition detection signal AU rises, the node A is gradually discharged by a time constant determined by the ON state resistance of the transistors 602 and 603 and the capacitance of the capacitor $C_A$.

When the node A is discharged, the node B is gradually charged by a time contant determined by the ON state resistance of the transistor 604 and 605 and the capacitance of the capacitor $C_A$.

When the node B is charged, the node C is gradually discharged by a time contant determined by the ON state resistance of the transistor 608 and 609 and the capacitance of the capacitor $C_C$.

When the node C is discharged, the node D is gradually charged by a time contant determined by the ON state resistance of the transistor 610 and 611 and the capacitance of the capacitor $C_D$.

When the node D is charged, the node E is gradually discharged by a time contant determined by the ON state resistance of the transistor 614 and 615 and the capacitance of the capacitor $C_E$.

When the node E is discharged, the node F is gradually charged by a time contant determined by the ON state resistance of the transistor 616 and 617 and the capacitance of the capacitor $C_F$.

When the node F is charged, the transistors 619 and 621 of the NAND circuit $G_2$ are turned OFF and ON, respectively. Since the transistors 620 and 622 are already turned OFF and ON, respectively, directly by the address transition detection signal AU, the voltage at the node G is changed from high to low.

Thus, when a time $t_{PW1}$ such as shout 90 ns has passed after at least one of the address signals $A_1, A_2, \ldots, A_n$ is changed, the timing pulse signal $PU_1$ is changed from high to low, and a short time later, the timing pulse signal $PU_2$ is changed from low to high.

The timing pulse signals $PU_1$ and $PU_2$ obtained as shown in FIG. 7A are used in the device of FIG. 1 where the power supply voltage $V_{CC}$ is 5V. In this case, the operation of the device of FIG. 1 is shown in FIG. 7B.

As shown in FIG. 7B, after at least one of the address signals $A_1, A_2, \ldots, A_n$ is changed, the voltages of the corresponding column selection signals such as $Y_1$ and $Y_2$ are changed, and the voltages of the corresponding word lines such as $WL_1$ and $WL_2$ are changed. Subsequently, the output voltage SA of the bias circuit BA of FIG. 3 is changed, and therefore, the output voltage DA of the comparator CMP of FIG. 3 is changed. Finally, when a time $t_{SO1}$ has passed, the output voltage $SO_1$ of the sense amplifier $SA_1$ of FIG. 3 is changed.

As shown in FIGS. 7A and 7B, when a time $t_{d1}$ has passed after the sense amplifier $SA_1$ completes its operation, the timing pulse signal $PU_1$ falls, to deactivate the sense amplifiers, thus reducing the power dissipation. Also, a time $t_{d2}$ later, the timing pulse signal $PU_2$ rises, to activate the output buffers. In this case, the time $t_{d1}$ is preferably about 5 ns, and the time $t_{d2}$ is determined by the inverter 626 of FIG. 6.

Then, the voltage at the output terminal $O_1$ is changed as shown in FIG. 7B. Thus, a read access time is defined by $t_{acc1}$ in FIG. 7B.

Figure 8A:
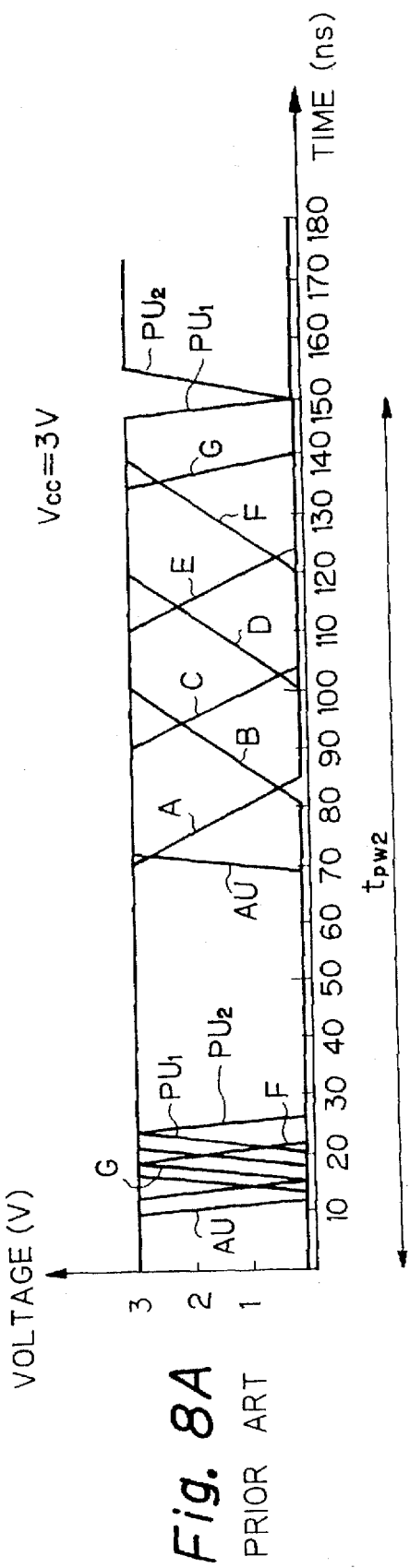
FIG. 8A is a timing diagram showing the operation of the circuit of FIG. 6 where $V_{CC}=3V$.

Under the condition that the power supply voltage $V_{CC}$ is 3V, the timing pulse generating circuit $PG_1$ of FIG. 6 is operated as shown in FIG. 8A. That is, when the address transition detection signal AU falls, the timing pulse signals $PU_1$ and $PU_2$ are rapidly changed as shown in FIG. 7A. On the other hand, when the address transition detection signal AU rises, the timing pulse signals $PU_1$ and $PU_2$ are changed with a larger delay time than those shown in FIG. 7A. For example, a time $t_{PW2}$ is about 150 ns.

Generally, a saturation current $I_{DS}$ flowing through a MOS transistor is defined by $$I_{DS}=(\beta/2)\cdot(V_{GS}-V_{th})^2 \tag{1}$$

where $\beta$ is a constant;
$V_{GS}$ is a gate-to-source voltage; and
$V_{th}$ is a threshold voltage. Therefore, the saturation current $I_{DS1}$ of the transistors 604, 610 and 616 is represented by $$I_{DS1}=(\beta_p/2)(|V_{thp}|-V_{CC})^2 \tag{2}$$

where $\beta_p$ is a value of $\beta$ of the transistors 604, 610 and 616. Also, the saturation current $I_{DS2}$ of the transistors 603, 609 and 615 is represented by $$I_{DS2}=(\beta_n/2)(V_{thn}-V_{CC})^2 \tag{3}$$

where $\beta_n$ is a value of $\beta$ of the transistors 603, 609 and 615.

For example, if $|V_{thp}|=V_{thn}=0.5V$, then $$I_{DS1}=9.925\,\beta_p\,(V_{CC}=5V) \tag{4}$$

$$I_{DS2}=9.925\,\beta_n\,(V_{CC}=5V) \tag{5}$$

$$I_{DS1}=3.125\,\beta_p\,(V_{CC}=3V) \tag{6}$$

$$I_{DS2}=3.125\,\beta_n\,(V_{CC}=3V) \tag{7}$$

Therefore, the saturation current of each MOS transistor of the delay circuit $G_1$ is reduced to about 30.9% as of $V_{CC}=5V$. Therefore, when the power supply voltage $V_{CC}$ is reduced from 5V to 3V, the time $t_{PW2}$ of FIG. 8A is remarkably increased.

The timing pulse signals $PU_1$ and $PU_2$ obtained as shown in FIG. 8A are used in the device of FIG. 1 where the power supply voltage $V_{CC}$ is 3V. In this case, the operation of the device of FIG. 1 is shown in FIG. 8B.

Figure 8B:
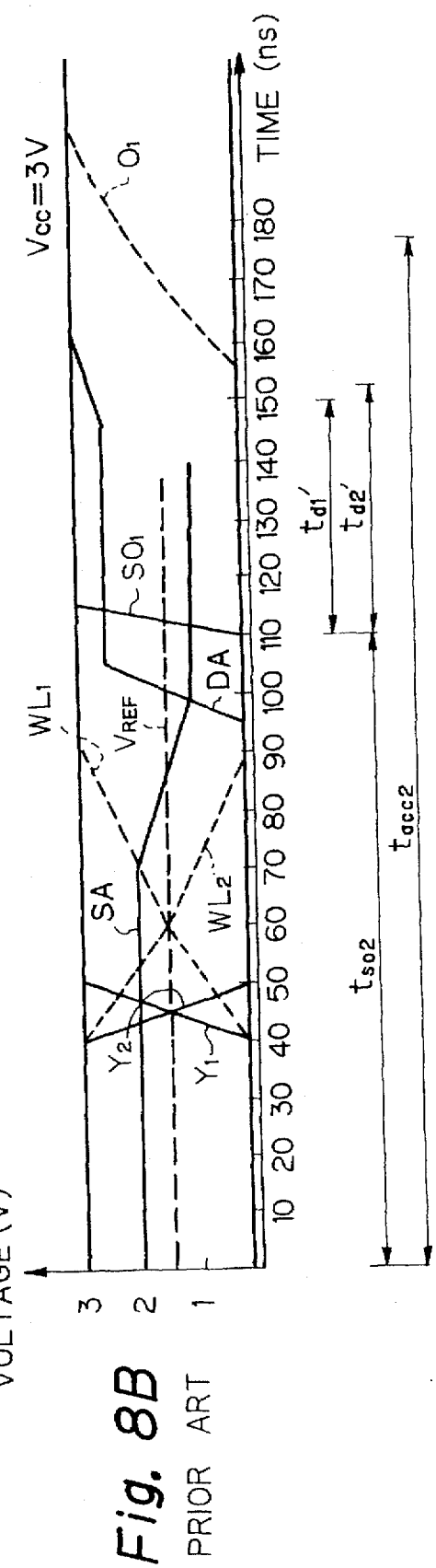
FIG. 8B is a timing diagram showing the operation of the device of FIG. 1 where $V_{CC}=3V$.

As shown in FIG. 8B, when a time $t_{SO2}$ has passed after at least one of the address signals $A_1, A_2, \ldots, A_n$ is changed, the output voltage $SO_1$ of the sense amplifier $SA_1$ of FIG. 3 is changed. In this case, since the address buffer AB, the X decoder XDEC, the Y decoder YDEC, and the like can be operated at a high speed even under a lower supply voltage, the time $t_{SO2}$ is just slightly larger than the time $t_{SO1}$ of FIG. 7B. On the other hand, as explained above, the time $t_{PW2}$ is very large, and therefore, delay times $t_{d1}'$ and $t_{d2}'$ as shown in FIG. 8B are very large. In other words, $$t_{PW2}-t_{PW1}>t_{SO2}-t_{SO1} \tag{8}$$

When the delay times $t_{d1}'$ and $t_{d2}'$ are increased, the power dissipation in the sense amplifiers is increased, and the read access time $t_{acc2}$ is also increased.

Thus, the timing pulse signals $PU_1$ and $PU_2$ generated by the timing pulse generating circuit $PG_1$ of FIG. 6 are greatly dependent upon the power supply voltage $V_{CC}$.

Figure 9:
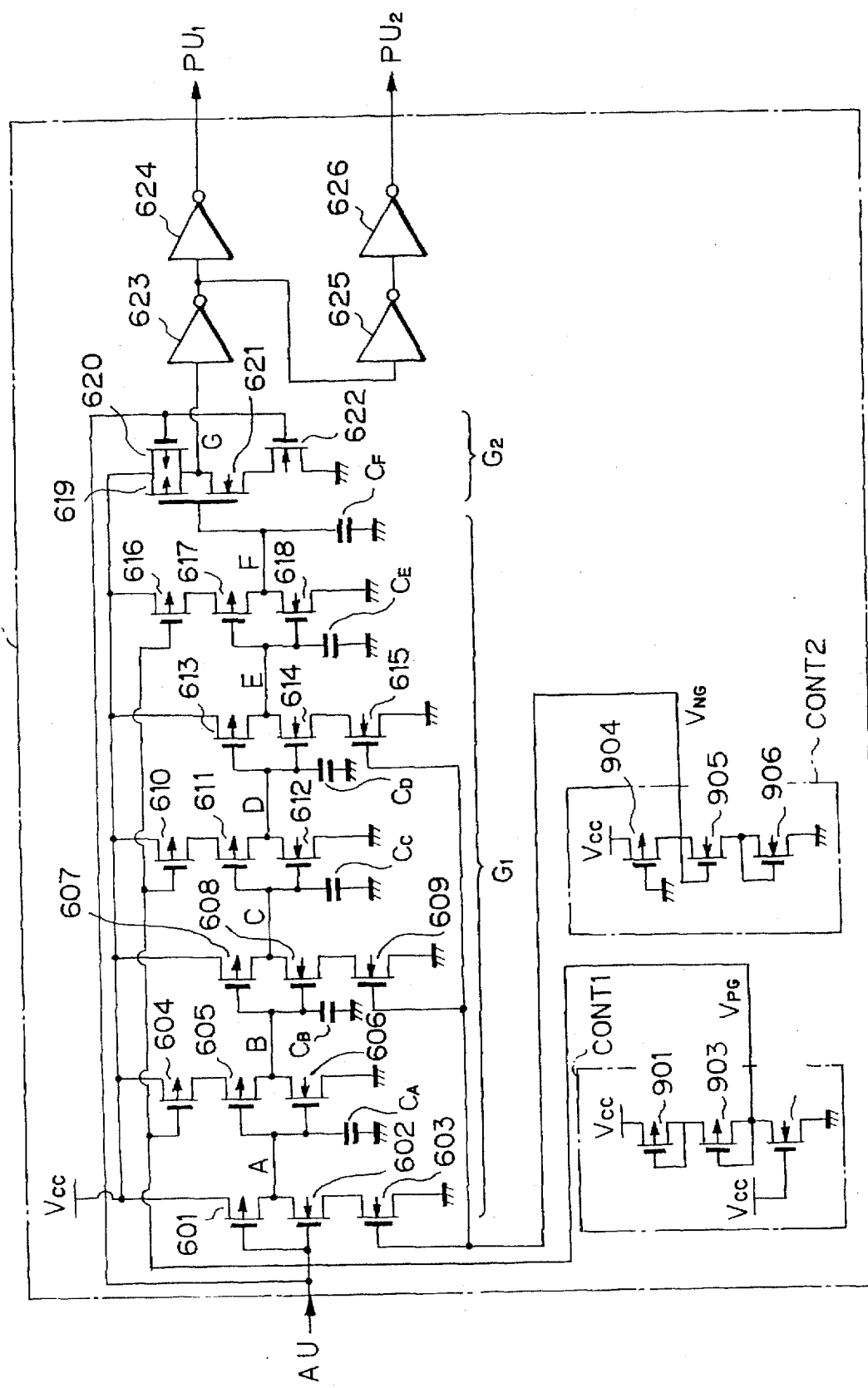
FIG. 9 is a circuit diagram illustrating another prior art timing pulse generating circuit.

In FIG. 9, which illustrates another prior art timing pulse generating circuit $PG_1'$ of FIG. 1, in order to alleviate the dependency of the timing pulse signals $PU_1$ and $PU_2$ upon the power supply voltage $V_{CC}$, the gate voltage $V_{PG}$ of the P-channel MOS transistors 604, 610 and 616 of FIG. 6 are changeable and are controlled by a control circuit CONT1 comprised of P-channel MOS transistors 901 and 902 and an N-channel MOS transistor 903. Also, the gate voltage $V_{NG}$ of the N-channel MOS transistors 603, 609 and 615 of FIG. 6 are changeable and are controlled by a control circuit CONT2 comprised of a P-channel MOS transistor 904 and N-channel MOS transistors 905 and 906.

Figure 10:
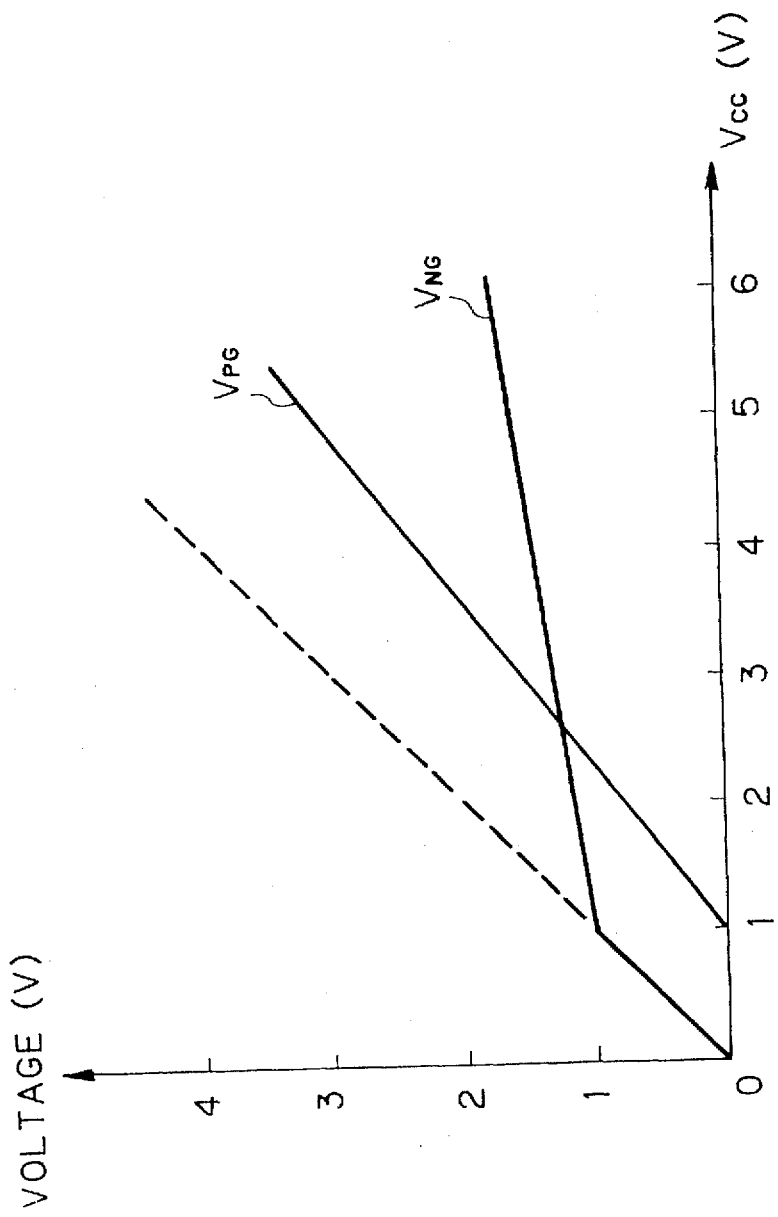
FIG. 10 is a diagram showing the gate voltages of FIG. 10.

As shown in FIG. 10, the gate voltage $V_{PG}$ of the transistors 604, 610 and 616 is represented by $$V_{PG}=V_{CC}-2|V_{thp}|-K1\cdot V_{CC} \tag{9}$$

where $V_{thp}$ is a threshold voltage of the P-channel transistors; and

K1 is a conrant less than 1. Also, as shown in FIG. 10, the gate voltage $V_{NG}$ of the transistors 603, 609 and 615 is represented by $$V_{NG}=2\cdot V_{thn}+K2\cdot V_{CC} \tag{10}$$

where $V_{thn}$ is a threshold voltage of the N-channel transistors; and

K2 is a contant less than 1.

Also, the saturation current $I_{DS3}$ of the transistors 604, 610 and 616 is represented by $$I_{DS3}=(\beta_p/2)\cdot(|V_{thp}|+K1\cdot V_{CC})^2 \quad (11)$$

Also, the saturation current $I_{DS4}$ of the transistors 603, 609 and 615 is represented by $$I_{DS4}=(\beta_n/2)\cdot(V_{thn}+K2\cdot V_{CC})^2 \quad (12)$$

Here, the constant K1 is determined by a ratio of the current drive capability of the transistors 901 and 902 to that of the transistor 903, and the constant K2 is determined by a ratio of the current drive capability of the transistors 905 and 906 to that of the transistor 904.

For example, if $K1=K2=0.2$, $|V_{thp}|=V_{thn}=0.5V$, then $$I_{DS3}=1.125\ \beta_p\ (V_{CC}=5V) \quad (13)$$

$$I_{DS4}=1.125\ \beta_n\ (V_{CC}=5V) \quad (14)$$

$$I_{DS3}=0.605\ \beta_p\ (V_{CC}=3V) \quad (15)$$

$$I_{DS4}=0.605\ \beta_n\ (V_{CC}=3V) \quad (16)$$

Therefore, the saturation currents of the transistors 604, 610, 616, 603, 609 and 615 under $V_{CC}=3V$ are only reduced to about 53.8% as of $V_{CC}=5V$.

In the timing pulse generating circuit $PG_1'$ of FIG. 9, however, the voltages $V_{PG}$ and $V_{NG}$ are dependent upon the threshold voltages $V_{thp}$ and $V_{thn}$. For example, if $|V_{thp}|=V_{thn}=0.7V$, the equations (15) and (16) are replaced by $$I_{DS3}=0.845\ \beta_p\ (V_{CC}=3V) \quad (17)$$

$$I_{DS4}=0.845\ \beta_n\ (V_{CC}=3V) \quad (18)$$

As a result, the current drive capabilities of the transistors 604, 610, 616, 603, 609 and 615 are increased by about 40%.

Figure 11:
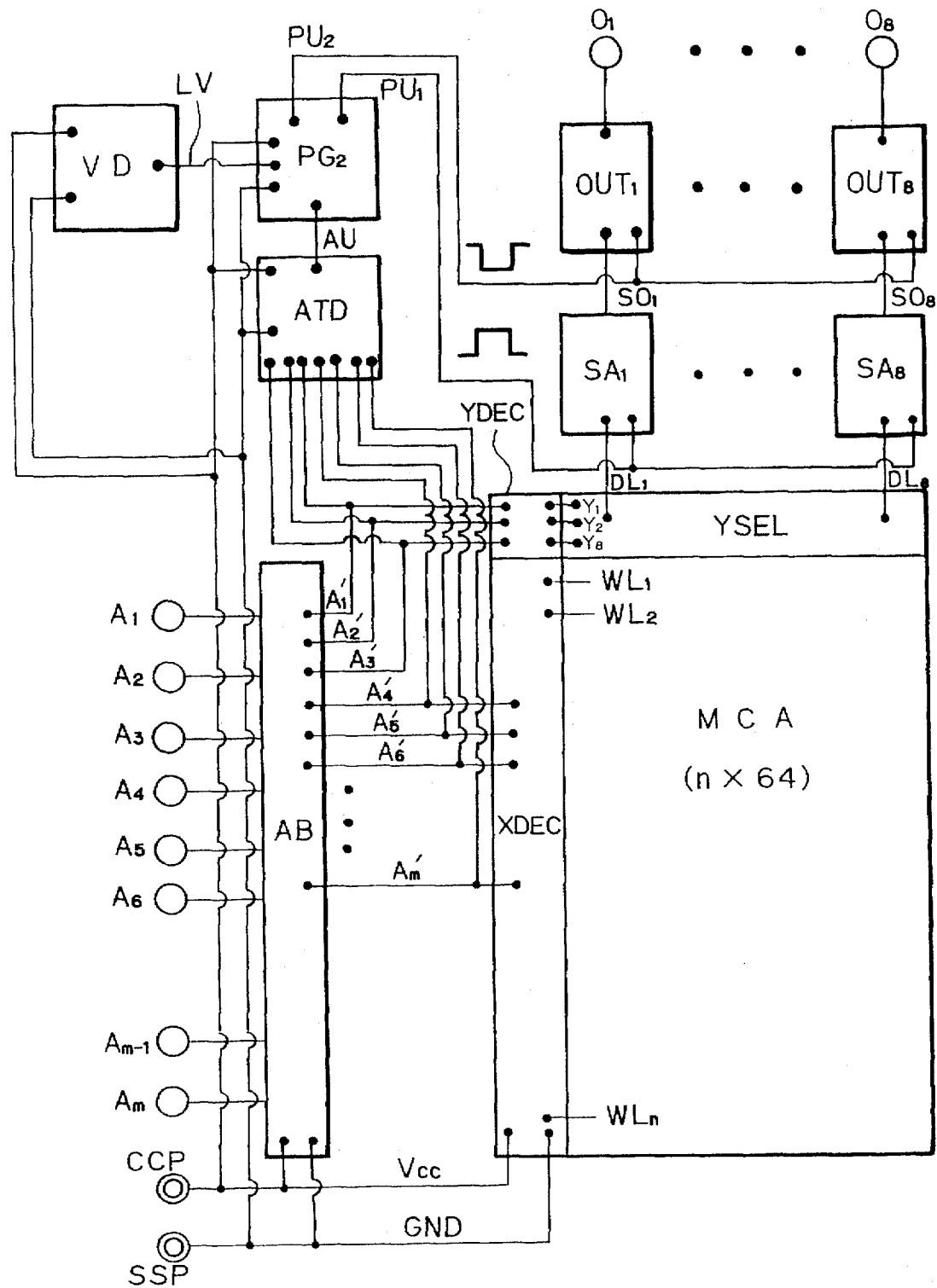
FIG. 11 is a block circuit diagram illustrating an embodiment of the semiconductor memory device according to the present invention.

In FIG. 11, which illustrates an embodiment of the present invention, a timing pulse generating circuit $PG_2$ is provided instead of the timing pulse generating circuit $PG_1$ of FIG. 1, and a power supply voltage determining circuit VD is added to the elements of FIG. 1.

The power supply voltage determining circuit VD determines whether or not the power supply voltage $V_{CC}$ is higher than a predetermined voltage $V_{CC0}$ such as 4V. As a result, when $V_{CC}$ is higher than $V_{CC0}$, an output signal LC of the power supply determining circuit VD is low. On the other hand, when $V_{CC}$ is lower than $V_{CC0}$, the output signal LC of the power supply voltage determining circuit VD is high. An example of the power supply voltage determining circuit VD is illustrated in FIG. 12.

Figure 12:
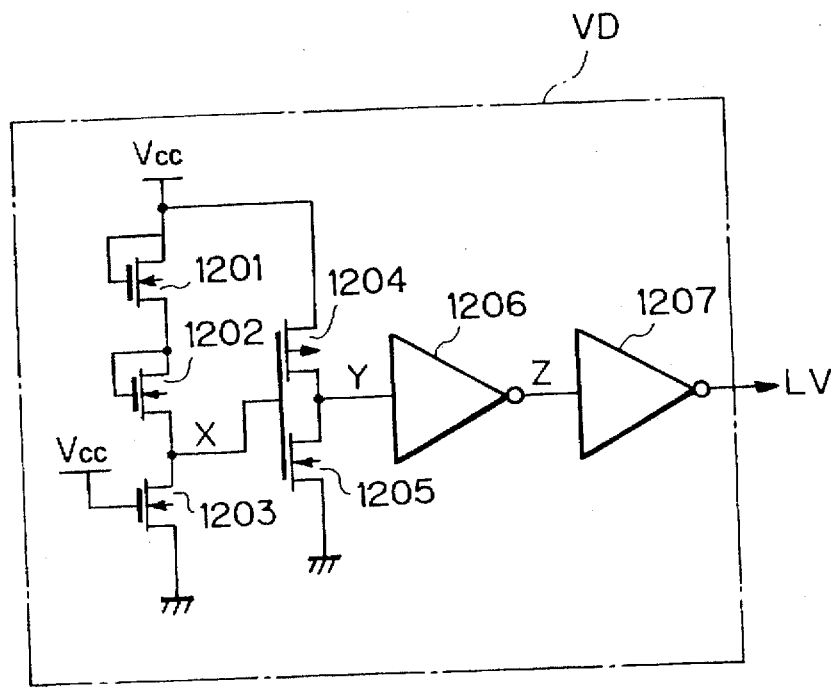
FIG. 12 is a detailed circuit diagram of the power supply voltage determining circuit of FIG. 11.

In FIG. 12, the power supply voltage determining circuit VD includes N-channel MOS transistors 1201 and 1202 serving as level shifters having gates 30 connected to the drains thereof, and an N-channel MOS transistor 1203 serving as a load. In this case, the current drive capabilities of the transistors 1201 and 1202 are larger than the current drive capability of the transistor 1203. Also, the power supply voltage determining circuit VD includes a P-channel MOS transistor 1204 and an N-channel MOS transistor 1205, which serve as an inverter. This inverter is driven by a voltage at a node X between the transistors 1202 and 1203. Further, the power supply voltage determining circuit VD includes two inverters 1206 and 1207 for wave-shaping a voltage at a node Y between the transistors 1204 and 1205 to generate the output signal LC.

Figure 13:
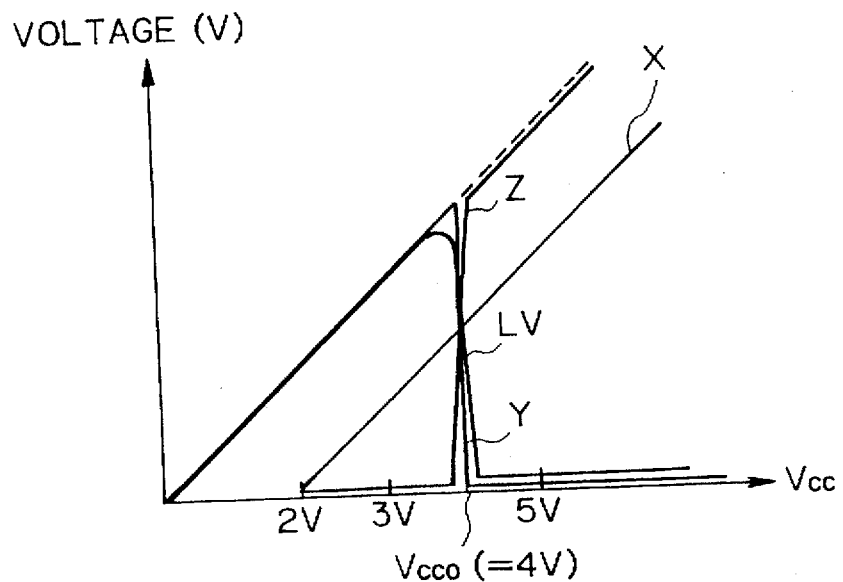
FIG. 13 is a graph showing the operation of the circuit of FIG. 12.

The operation of the power supply voltage determining circuit VD is explained next with reference to FIG. 13. Here, if a threshold voltage of each of the transistors 1201, 1202 and 1203 is $V_{thn1}$ and a threshold voltage of the transistor 1205 is $V_{thn2}$, then the voltage $V_{CC0}$ is $$V_{CC0}=2V_{thn1}+V_{thn2} \quad (19)$$

Further, if $V_{thn1}=1V$ and $V_{thn2}=2V$, then $$V_{CC0}=4V \quad (20)$$

When the power supply voltage $V_{CC}$ is lower than 2V, the voltage at the mode X remains zero, so that the transistor 1205 is turned OFF. Therefore, the voltage at the node Y follows the power supply voltage $V_{CC}$.

When the power supply voltage $V_{CC}$ is between 2V and $V_{CC0}$ (=4V), the voltage at the node X follows the power supply voltage $V_{CC}$ while maintaining the difference $2V_{thn1}$ (=2V) therebetween.

When the power supply voltage $V_{CC}$ is 4V, the voltage at the node X is 2V, so that the transistor 1205 is turned ON. Therefore, the voltage at the node Y is changed from high to low. As a result, the output voltage Z of the inverter 1206 is changed from low to high, and accordingly, the output signal LC of the power supply voltage determining circuit CD is changed from high to low.

Thus, the power supply voltage determining circuit VD can determine whether the power supply voltage $V_{CC}$ is around 5V or around 3V.

Figure 14:
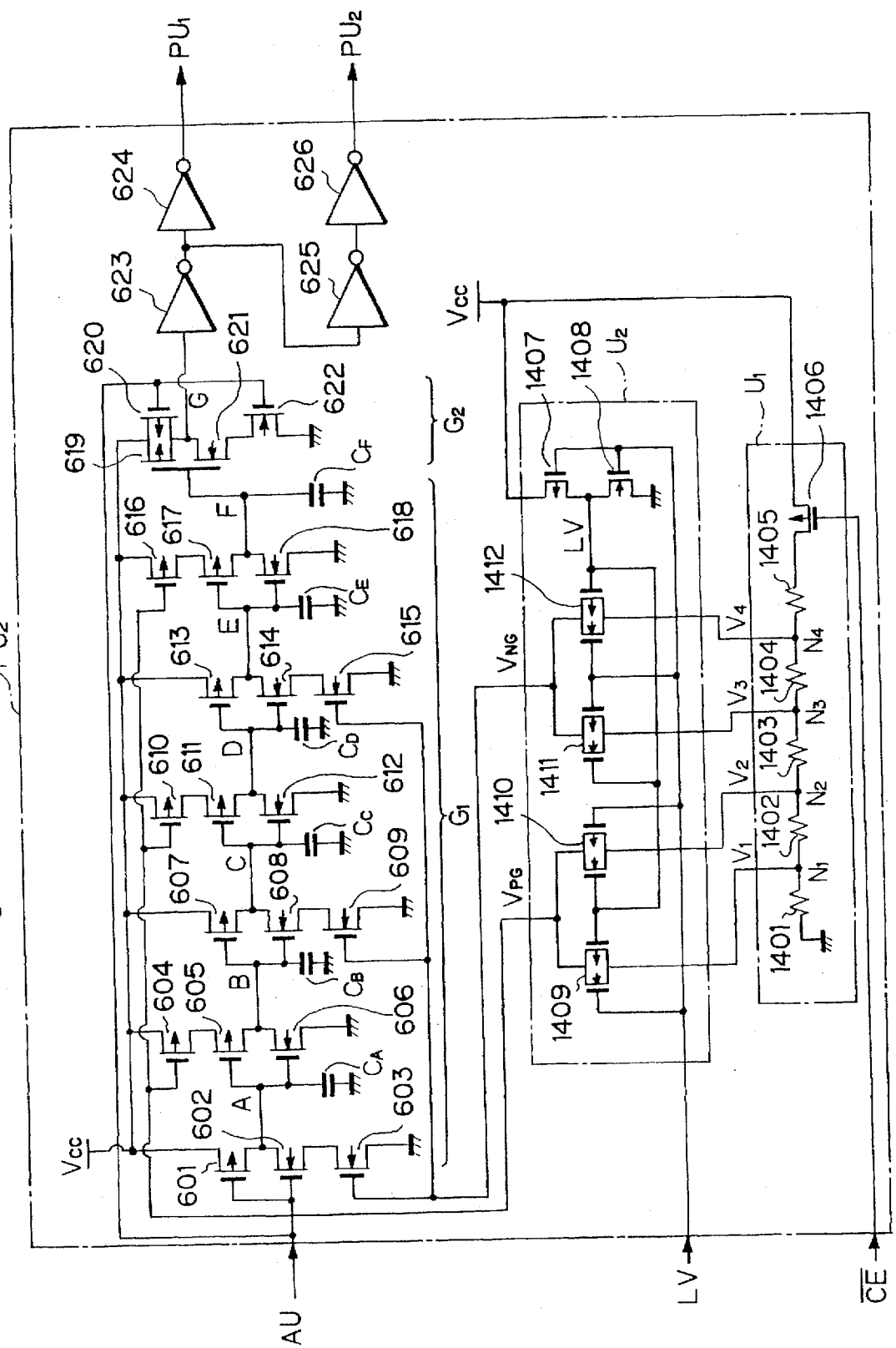
FIG. 14 is a detailed circuit diagram of the timing pulse generating circuit of FIG. 11.

In FIG. 14, which is a detailed circuit diagram of the timing pulse generating circuit $PG_2$ of FIG. 11, a voltage divider circuit $U_1$ and a switching circuit $U_2$ are provided instead of the control circuits CONT1 and CONT2 of FIG. 9.

The voltage divider circuit $U_1$ includes resistors 1401, 1402, 1403, 1404 and 1405 connected in series, and a P-channel MOS transistor 1406 controlled by an inverted signal of the chip enable signal CE. If the resistance values of the resistors 1401, 1402, 1403, 1404 and 1405 are the same as each other, voltages $V_1$, $V_2$, $V_3$ and $V_4$ at nodes $N_1$, $N_2$, $N_3$ and $N_4$, respectively, are as follows:

$$V_1=V_{cc}/5$$

$$V_2=2V_{cc}/5$$

$$V_3=3V_{cc}/5$$

$$V_4=4V_{cc}/5$$

Therefore, if $V_{CC}=5V$, then, $V_1=1V$, $V_2=2V$, $V_3=3V$, and $V_4=4V$. On the other hand, if $V_{CC}=3V$, then, $V_1=0.6V$, $V_2=1.2V$, $V_3=1.8Y$ and $V_4=2.4V$. Only when the control is in a read mode, is the transistor 1406 turned ON to activate the voltage divider circuit $U_1$, thus reducing the power dissipation.

The switching circuit U2 includes an inverter formed by a P-channel MOS transistor 1407 and an N-channel MOS transistor 1408 for inverting the output signal LV of the power supply voltage determining circuit DV. Also, the switching circuit $U_2$ includes transfer gate switches 1409 and 1410 controlled by the signal LV and its inverted signal to generate the gate voltage $V_{PG}$ of the P-channel MOS transistors 604, 610 and 616. That is, when $V_{CC}=5V$, the transfer gate switches 1409 and 1410 are turned OFF and ON, respectively, so that $V_{PG}$ is equal to $V_2$, i.e., $V_{PG}=2V$. On the other hand, when $V_{CC}=3V$, the transfer gate switches 1409 and 1410 are turned ON and OFF, respectively, so that $V_{PG}$ is equal to $V_1$, i.e., $V_{PG}$=0.6V. Further, the switching circuit $U_2$ includes transfer gate switches 1411 and 1412 controlled by the signal LV and its inverted signal to generate the gate voltage $V_{NG}$ of the N-channel MOS transistors 603, 609 and 615. That is, when $V_{CC}$=5V, the transfer gate switches 1411 and 1412 are turned ON and OFF, respectively, so that $V_{NG}$ is equal to $V_3$, i.e., $V_{NG}$=3V. On the other hand, when $V_{CC}$=3V, the transfer gate switches 1411 and 1412 are turned OFF and ON, respectively, so that $V_{NG}$ is equal to $V_4$, i.e., $V_{NG}$=2.4V.

The timing pulse generating circuit PG$_2$ of FIG. 14 is designed so that the timing pulse generating circuit PG$_2$ of FIG. 14 operates in the same way as in the timing pulse generating circuit PG$_1$ of FIG. 6 under the condition that the power supply voltage $V_{CC}$ is 5V. That is, when $V_{CC}$=5V, then $V_{PG}$=2V and $V_{NG}$=3V. In this case, the operation of the timing pulse generating circuit PG$_2$ of FIG. 14 is operated as shown in FIG. 15A. Also, the timing pulse signals PU$_1$ and PU$_2$ obtained as shown in FIG. 15A are used in the device of FIG. 11 where the power supply voltage $V_{CC}$ is 5V. In this case, the device of FIG. 11 is shown in FIG. 15B which is the same as FIG. 7B.

Figure 16A:
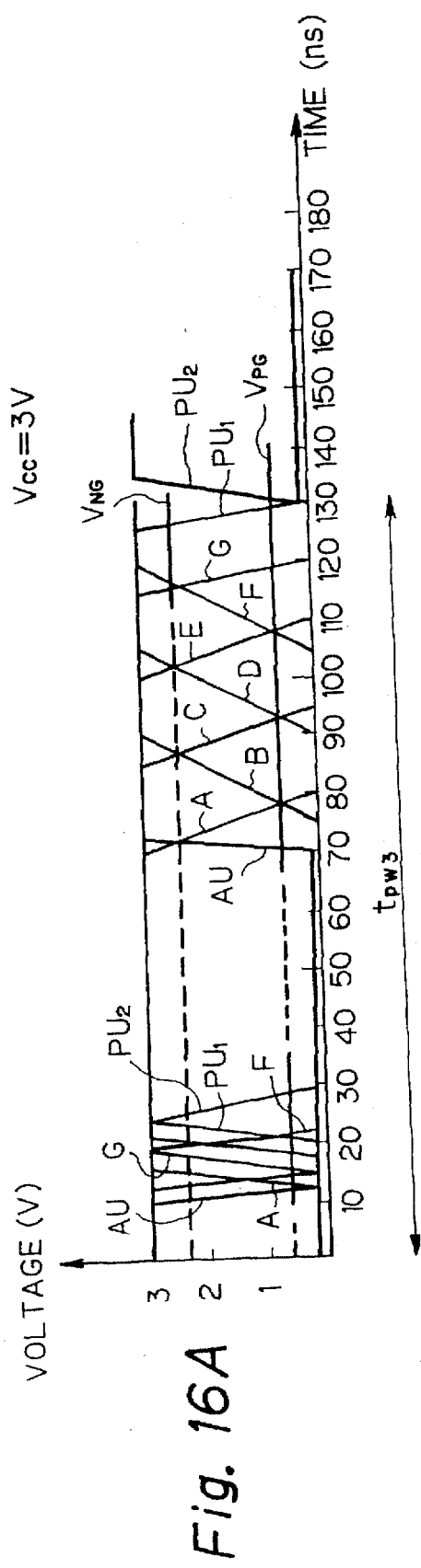
FIG. 16A is a timing diagram showing the operation of the circuit of FIG. 14 where $V_{CC}=3V$.
Figure 16B:
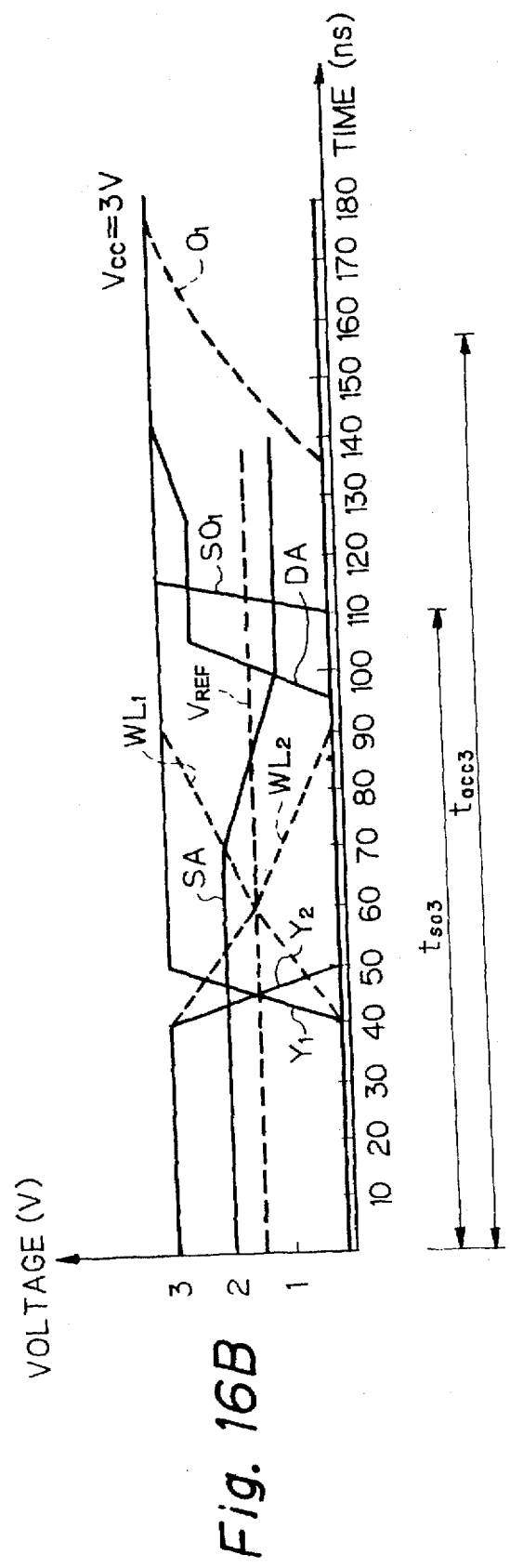
FIG. 16B is a timing diagram showing the operation of the device of FIG. 11 where $V_{CC}=3V$.

Under the condition that the power supply voltage $V_{CC}$ is 3V, the timing pulse generating circuit PG$_2$ of FIG. 14 is operated as shown in FIG. 16A. In this case, $V_{PG}$=0.6V and $V_{NG}$=2.4V. That is, when the address transition detection signal AU falls, the timing pulse signals PU$_1$ and PU$_2$ are rapidly changed as shown in FIG. 16A. On the other hand, when the address transition signal ATD rises, the timing pulse signal PU$_1$ and PU$_2$ are changed with a large delay time. However, this delay time is smaller than that shown in FIG. 8A. For example, a time $t_{PW3}$ is about 130 ns, and is shorter than the time $t_{PW2}$ (=150 ns) of FIG. 8A. The timing pulse signals PU$_1$ and PU$_2$ obtained as shown in FIG. 16A are used in the device of FIG. 11 where the power supply voltage $V_{CC}$ is 3V. In this case, the operation of the device of FIG. 11 is shown in FIG. 16B. That is, since the time $t_{PW3}$ is shorter than the time $t_{PW2}$, a sense speed time $t_{SO3}$ is shorter than the sense speed time $t_{SO2}$ of FIG. 8B, and accordingly, a read access time $t_{acc3}$ is shorter than the read access time $t_{acc2}$ of FIG. 8B. Thus, the power dissipation can be reduced, and the read access speed can be increased.

The reason why the time $t_{PW3}$ of FIG. 16A is shorter than the time $t_{PW3}$ of FIG. 8A is due to the difference in the saturation currents of the transistors 604, 610 and 616 and the transistors 603, 609 and 615 between the case where $V_{CC}$=5V and the case where $V_{CC}$=3V.

That is, the saturation current $I_{DS5}$ of the transistors 604, 610 and 616 where $V_{CC}$=5V is represented by $$I_{DS5} = (\beta_P/2)(V_{GS} - |V_{thp}|)^2 \qquad (21)$$
$$= (\beta_P/2)(2-5-0.5)^2$$
$$= 3.145\beta_P(V_{CC}=5V)$$

Also, the saturation current $I_{DS6}$ of the transistors 603, 609 and 615 where $V_{CC}$=5V is represented by $$I_{DS6} = (\beta_n/2)(V_{GS} - |V_{thn}|)^2 \qquad (22)$$
$$= (\beta_n/2)(3-0.5)^2$$
$$= 3.125\beta_n(V_{CC}=5V)$$

Also, the saturation current $I_{PS5}$ of the transistors 604, 610 and 616 where $V_{CC}$=3V is represented by $$I_{PS5} = (\beta_P/2)(V_{GS} - |V_{thp}|)^2 \qquad (23)$$
$$= (\beta_P/2)(0.6-3-0.5)^2$$
$$= 1.805\beta_P(V_{CC}=3V)$$

Further, the saturation current $I_{PS6}$ of the transistor 603, 609 and 615 where $V_{CC}$=3V is represented by $$I_{PS6} = (\beta_n/2)(V_{GS} - V_{thn})^2 \qquad (24)$$
$$= (\beta_n/2)(2.4-0.5)^2$$
$$= 1.805\beta_n(V_{CC}=3V)$$

Therefore, the saturation currents of the transistors 604, 610, 616, 603, 609 and 615 when $V_{CC}$=3V are reduced to about 57.8% of $V_{CC}$=5V.

Also, in FIG. 14, since the gate voltages $V_{PG}$ and $V_{NG}$ are determined by the resistors 1401 to 1405, the gate voltages $V_{PG}$ and $V_{NG}$ are not dependent upon the threshold voltages of the transistors, and therefore, the read access speed is not dependent upon the threshold voltages of the transistors.

Figure 17:
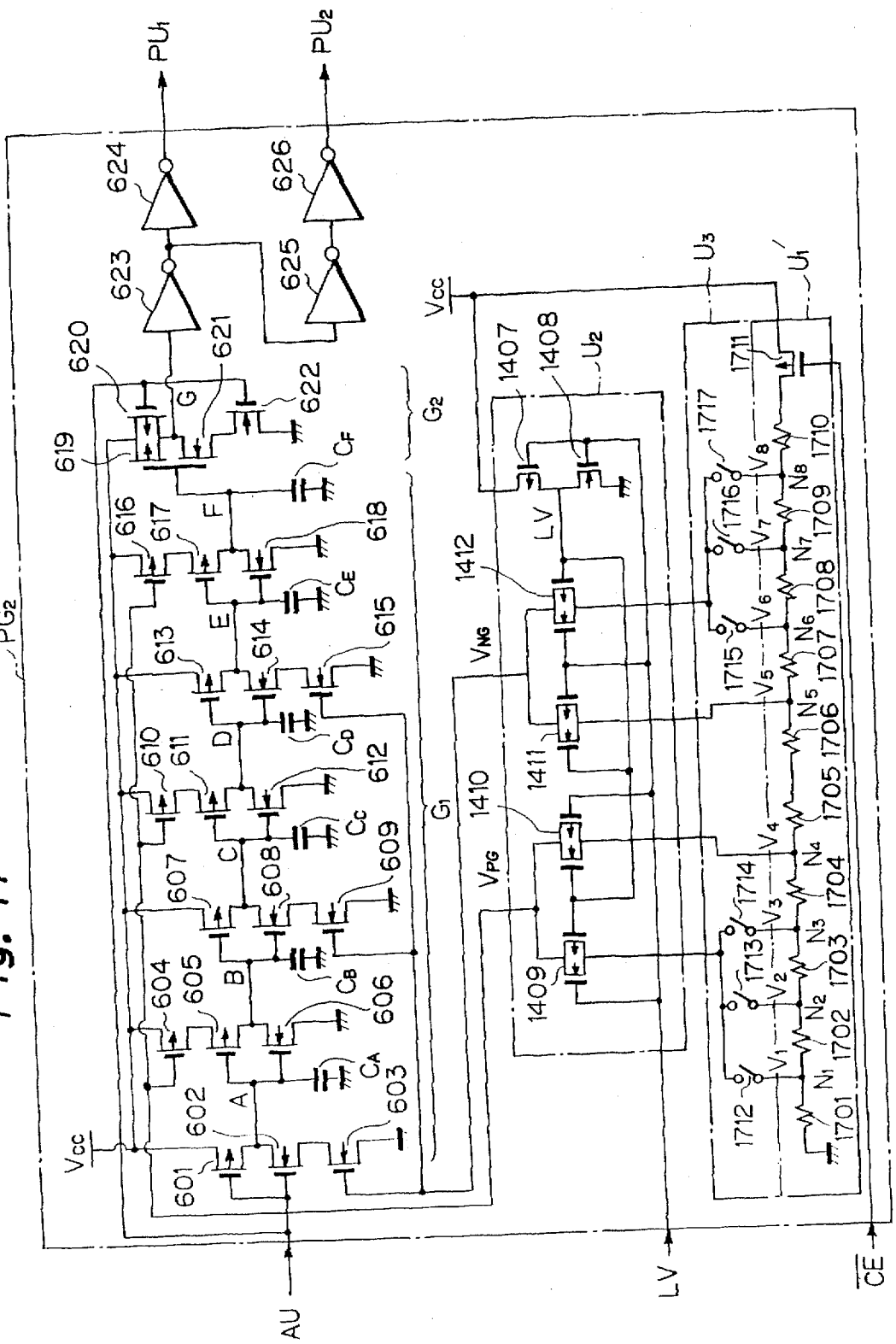
FIG. 17 is a circuit diagram illustrating a modification of the timing pulse generating circuit of FIG. 14.

In FIG. 17, which illustrates a modification of the timing pulse generating circuit PG$_2$ of FIG. 14, a voltage divider $U_1'$ is provided instead of the voltage divider $U_1$ of FIG. 14, and a switching circuit $U_3$ is added to the elements of FIG. 14. The voltage divider $U_1'$ includes resistors 1701, 1702, ..., 1710 connected in series, a P-channel MOS transistor 1711 controlled by the inverted signal of the chip enable signal CE, and the switching circuit $U_3$ includes switches 1712, 1713, ..., 1717. If the resistance values of the resistors 1701, 1702, ..., 1710 are the same as each other, voltages $V_1, V_2, \ldots, V_8$ at nodes $N_1, N_2, \ldots, N_8$ are as follows:

$V_1 = V_{cc}/10$ $V_2 = 2V_{cc}/10$ $V_3 = 3V_{cc}/10$ $V_4 = 4V_{cc}/10$ $V_5 = 6V_{cc}/10$ $V_6 = 7V_{cc}/10$ $V_7 = 8V_{cc}/10$ $V_8 = 9V_{cc}/10$

The switches 1712 through 1717 are turned ON and OFF by using a photolithograply and etching process performed upon a metal layer or by using a laser trimming performed upon fuses or a fuse-type PROM.

Figure 18:
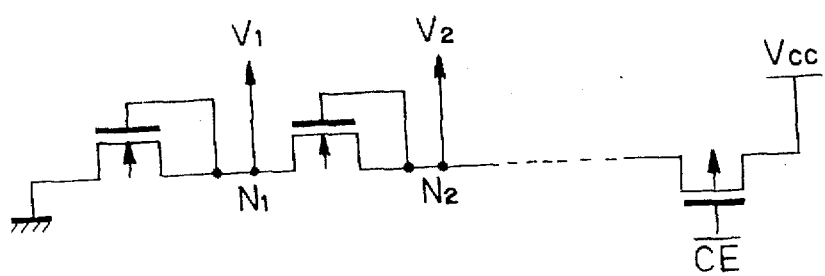
FIG. 18 is a circuit diagram illustrating a modification of the voltage divider of FIGS. 14 and 17.

For example, in order to prepare two kinds of power supply voltages 5V and 3.3V, only the switches 1714 and 1715 are turned ON and the others are turned OFF. As a result, if $V_{CC}$=5V, $V_{PG} = V_4$
$= 4V_{CC}/10$
$= 2V$
$V_{NG} = V_5$
$= 6V_{CC}/10$
$= 3V$ On the other hand, if $V_{CC}$=3.3V, $V_{PG} = V_3$
$= 3V_{CC}/10$
$= 0.99V$
$V_{BG} = V_6$
$= 7V_{CC}/10$
$= 2.31V$ Also, in order to prepare two kinds of power supply voltages 5V and 3.0V, only the switches 1713 and are turned ON and the others are turned OFF. As a result, if $V_{CC}$=5V, $V_{PG} = 2V$ $V_{NG} = 3V$ On the other hand, if $V_{CC} = 3.0V$, $V_{PG} = V_2$
$= 2V_{CC}/10$
$= 0.6V$ $V_{NG} = V_7$
$= 8V_{CC}/10$
$= 2.4V$ Further, in order to prepare two kinds of power supply voltages 5V and 2.5V, only the switches 1712 and are turned ON and the others are turned OFF. As a result, if $V_{CC}=5V$, $V_{PG} = 2V$ $V_{NG} = 3V$ On the other hand, if $V_{CC}=2.5V$, $V_{PG} = V_1$
$= V_{CC}/10$
$= 0.25V$ $V_{NG} = V_8$
$= 9V_{CC}/10$
$= 2.25V$ In FIG. 17, the number of resistors and the number of switches in the voltage divider $U_1'$ can be changed, thus adopting various ranges of a power supply voltage. Also, in FIGS. 14 and 17, the resistors in the voltage dividers $U_1$ and $U_1'$ can be formed by MOS transistors as illustrated in FIG. 18.

As explained hereinbefore, according to the present invention, in a semiconductor memory device adapted to a plurality of kinds of ranges of a power supply voltage, the power dissipation in a read mode can be reduced, and the read access speed can be enhanced.

I claim:

1. A semiconductor memory device comprising:
   a power supply voltage determining circuit for determining whether or not a power supply voltage applied to said device is higher than a certain voltage;
   an address transition detecting circuit for detecting a transition in at least one of address signals;
   a timing pulse generating circuit, connected to said power supply voltage determining circuit and said address transtion detecting circuit, for generating a first timing pulse signal in response to the transition of said address signals, a pulse width of said first timing pulse signal being controlled in accordance with whether or not said power supply voltage is higher than said certain voltage;
   a memory cell array; and
   a sense amplifier, operatively connected to said memory cell array, for sensing data read from said memory cell array in accordance with said address signals,
   said sense amplifier being connected to said timing pulse generating circuit and being made active by said first timing pulse signal.

2. The device as set forth in claim 1, further comprising an output buffer, connected to said sense amplifier and said timing pulse generating circuit, for outputting an output signal of said sense amplifier in accordance with a second timing pulse signal generated from said timing pulse generating circuit,
   said second timing pulse signal becoming active every time said first timing pulse signal becomes inactive.

3. The device as set forth in claim 1, wherein said timing pulse generating circuit comprises:
   a delay circuit connected to said address transition detecting circuit and powered by said power supply voltage;
   a gate circuit, connected to said address transition detecting circuit and said delay circuit, for performing a logic operation upon an output signal of said address transition detecting circuit and an output signal of said delay circuit to generate said first timing pulse signal;
   a voltage divider for dividing said power supply voltage to generate a plurality of voltages;
   a first switching circuit connected between said delay circuit and said voltage divider and being controlled by said power supply voltage determining circuit to adjust a delay time of said delay circuit.

4. The device as set forth in claim 3, wherein said delay circuit comprises a plurality of charging and discharging circuits connected in series and powered by said power supply voltage,
   said first switching circuit being controlled so that a charging capability and a discharging capability of each of said charging and discharging circuits is approximately the same regardless of the output signal of said power supply voltage determining circuit.

5. The device as set forth in claim 4, wherein each of said charging and discharging circuits comprises at least a P-channel MOS transistor and an N-channel MOS transistor connected in series, and a capacitor charged by said P-channel MOS transistor and discharged by said N-channel MOS transistor,
   said first switching circuit controlling a saturation current of one of said P-channel MOS transistor and said N-channel MOS transistor of each of said charging and discharging circuits.

6. The device as set forth in claim 3, wherein said gate circuit comprises a NAND circuit.

7. The device as set forth in claim 3, wherein said timing pulse generating circuit comprises a plurality of second switching circuits connected between said first switching circuit and nodes of said voltage divider.

8. The device as set forth in claim 7, wherein each of said second switching circuits is formed by presence or absence of a connection.

9. The device as set forth in claim 7, wherein said second switching circuits are formed by a fuse-type PROM.

10. The device as set forth in claim 3, wherein said voltage divider comprises a series arrangement of a plurality of resistors powered by said power supply voltage.

11. The device as set forth in claim 3, wherein said voltage divider comprises a series arrangement of gate-to-drain-connected MOS transistors powered by said power supply voltage.

* * * * *